United States Patent
Chang et al.

(10) Patent No.: US 8,068,333 B2
(45) Date of Patent: Nov. 29, 2011

(54) PRINTED CIRCUIT BOARD ASSEMBLY

(75) Inventors: Che-Jui Chang, Taipei Hsien (TW);
Mei-Hui Chen, Taipei-Hsien (TW);
Tsung-Yuan Tsai, Taipei-Hsien (TW)

(73) Assignee: Hon Hai Precision Industry Co., Ltd., Tu-Cheng, New Taipei (TW)

( * ) Notice: Subject to any disclaimer, the term of this patent is extended or adjusted under 35 U.S.C. 154(b) by 385 days.

(21) Appl. No.: 12/470,416

(22) Filed: May 21, 2009

(65) Prior Publication Data
US 2010/0149738 A1  Jun. 17, 2010

(30) Foreign Application Priority Data
Dec. 17, 2008 (CN) .......................... 2008 1 0306317

(51) Int. Cl.
*G06F 1/16* (2006.01)
(52) U.S. Cl. .................... 361/679.02; 361/767
(58) Field of Classification Search ............... 361/679.02
See application file for complete search history.

(56) References Cited

U.S. PATENT DOCUMENTS

| | | | | |
|---|---|---|---|---|
| 4,888,665 A * | 12/1989 | Smith | ........................... | 361/780 |
| 6,894,220 B1 * | 5/2005 | Kozak et al. | ..................... | 174/51 |
| 7,071,016 B2 * | 7/2006 | Park et al. | ........................ | 438/48 |
| 7,835,158 B2 * | 11/2010 | Kinsley | ........................... | 361/767 |
| 2011/0047392 A1 * | 2/2011 | Wang et al. | ..................... | 713/300 |

* cited by examiner

*Primary Examiner* — Lisa Lea Edmonds
(74) *Attorney, Agent, or Firm* — Altis Law Group, Inc.

(57) ABSTRACT

A PCB assembly includes a PCB. The PCB includes a detecting pad, a detecting voltage terminal and the controller. The detecting pad includes an accessing layer and a grounding layer. The grounding layer is connected to the ground. The accessing layer is electrically insulated from the grounding layer. The detecting voltage terminal is connected to the accessing layer of the detecting pad. The controller is connected to the accessing layer of the detecting pad. When the accessing layer is not connected to the grounding layer, the controller receives a high level voltage signal from the detecting pad. When the accessing layer is connected to the grounding layer, the controller receives a low level voltage signal from the detecting pad, and therefore the PCB is capable of determining what computer system the PCB is coupled with.

18 Claims, 4 Drawing Sheets

PRINTED CIRCUIT BOARD ASSEMBLY

BACKGROUND

1. Technical Field

The present disclosure relates to a printed circuit board (PCB) assembly, especially to a PCB assembly for automatically detecting a computer system the PCB assembly is coupled to.

2. Description of Related Art

A PCB, such as a motherboard usually has multiple functions for coupling to different computer systems. The PCB may have different soft configurations to couple to these different computer systems. For example, a server motherboard may alternatively used in a 1 U (unit) server chassis or in a 2 U server chassis. A server chassis the server motherboard used is often identified by human. The corresponding configuration files may be set by adjusting a jumper on the server motherboard manually. It is time consuming to manually identify and adjust the computer system the PCB coupled in.

DETAILED DESCRIPTION

Figure 1:
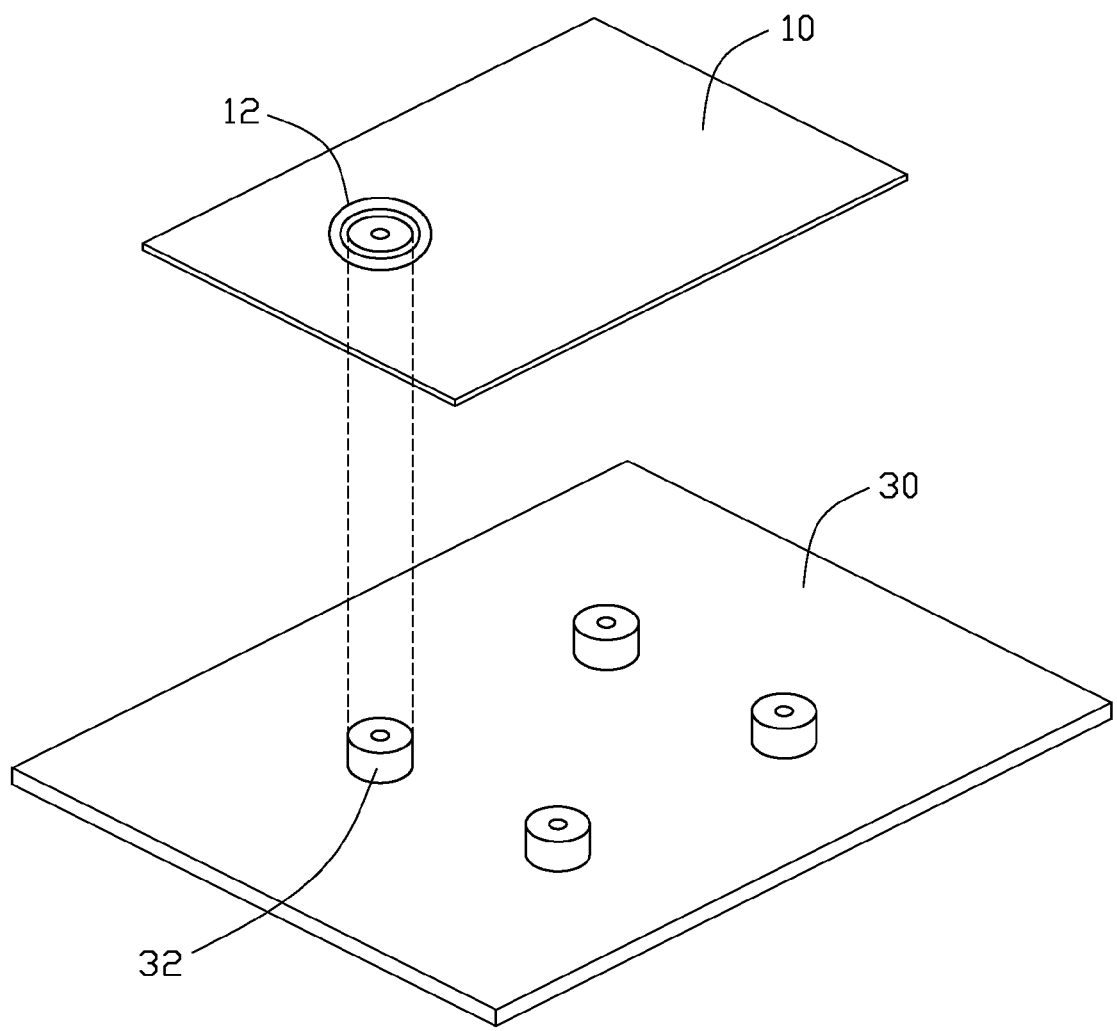
FIG. 1 is an exploded, schematic view of one embodiment of a PCB being installed in a first chassis.
Figure 4:
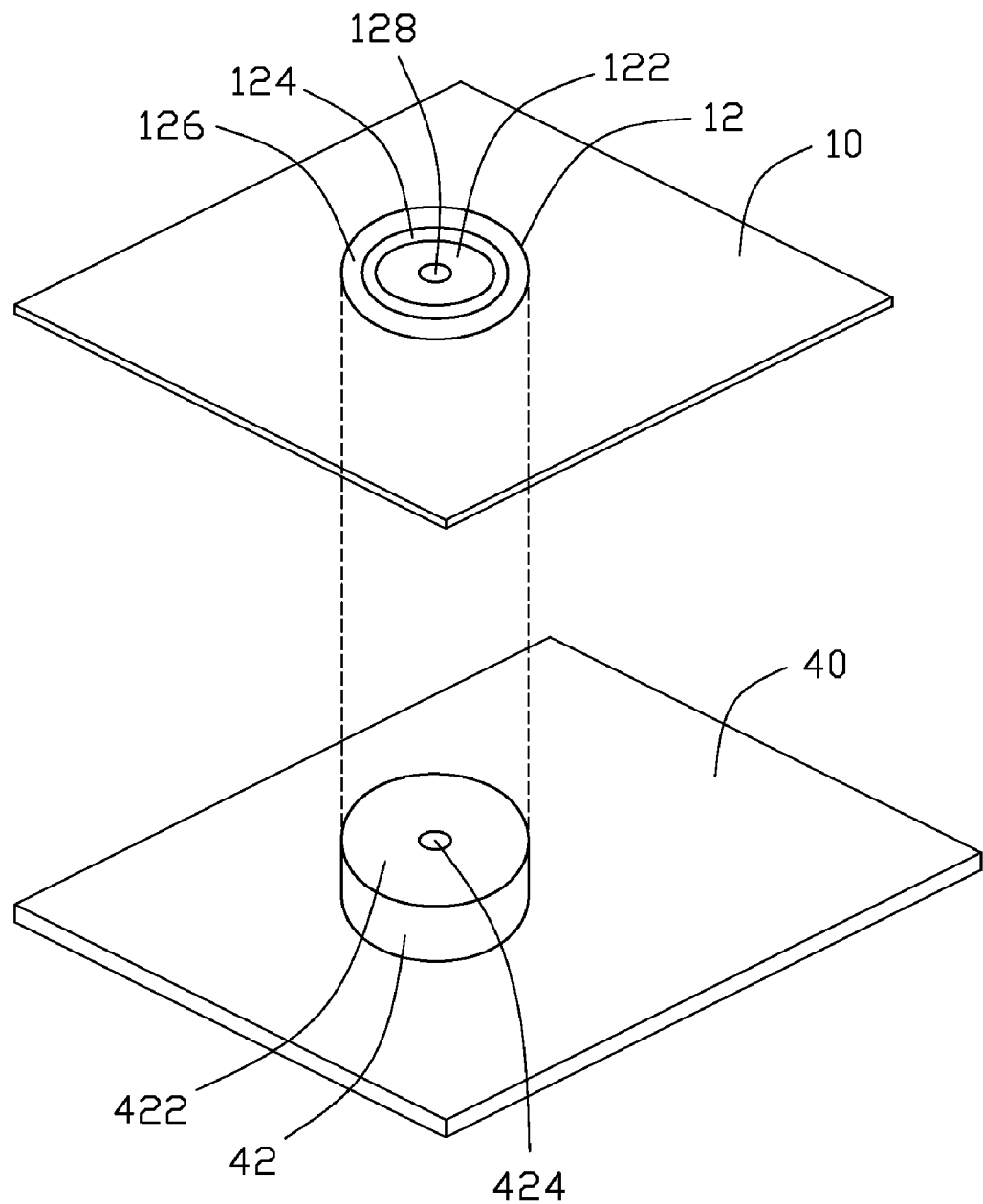
FIG. 4 is similar to FIG. 3, but showing the PCB being installed in a second chassis.

Referring to FIG. 1 and FIG. 4, in one embodiment, a printed circuit board (PCB) 10 is installable in a first chassis 30 or a second chassis 40. The first chassis 30 is associated with a first computer system, and the second chassis 40 is associated with a second computer system. The PCB 10 can automatically detect one of the two types of computer systems the PCB 10 is coupled to.

Figure 2:
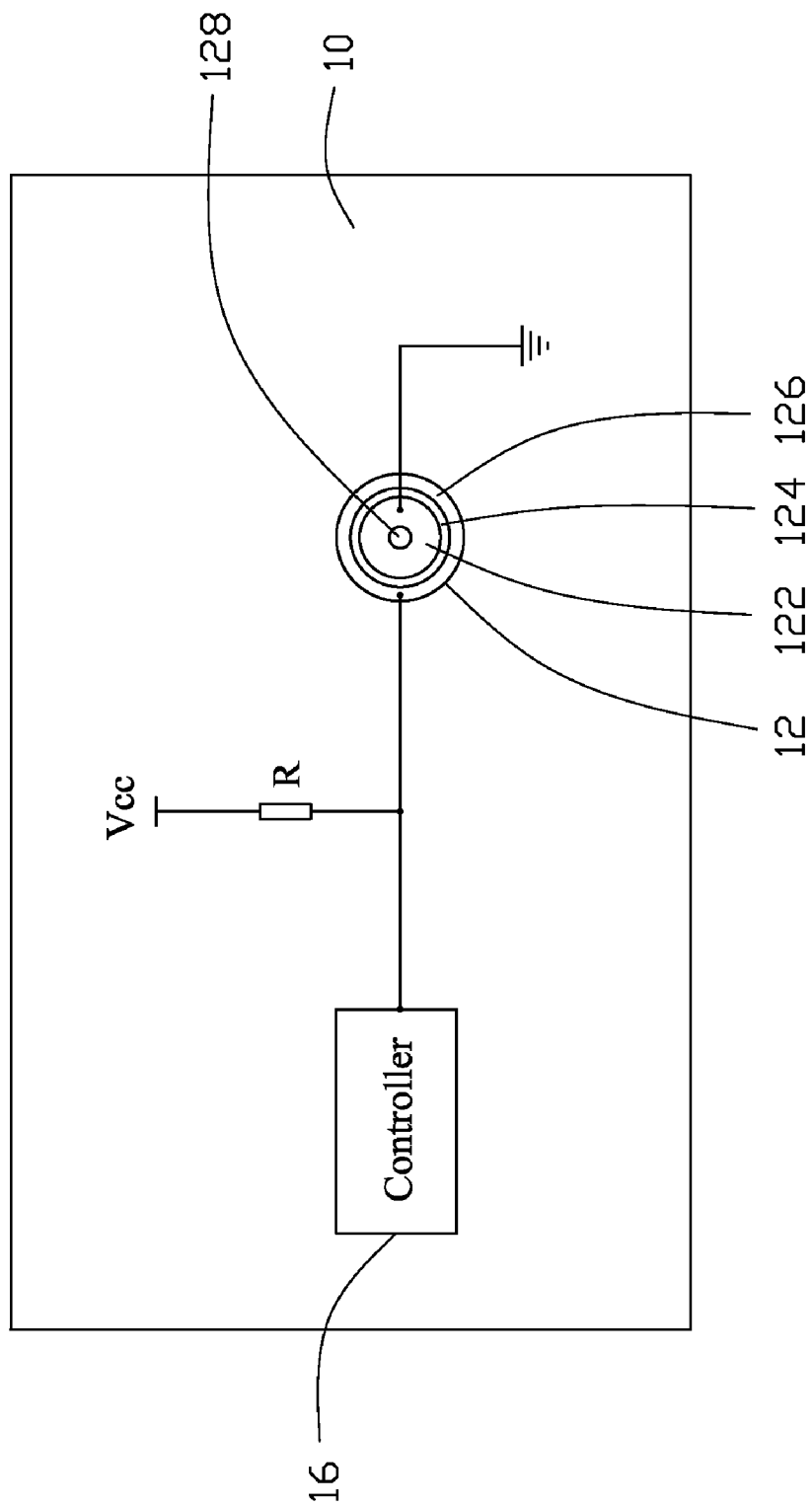
FIG. 2 is a circuit view of the embodiment of the PCB.

Referring to FIG. 2, the PCB 10 includes a circular detecting pad 12, a detecting voltage terminal Vcc, and a controller 16. The detecting pad 12 includes a circular grounding layer 122, a ring-shaped insulating layer 124 disposed around the grounding layer 122 and a ring-shaped accessing layer 126 disposed around the grounding layer 122. The insulating layer 124 and the accessing layer 126 are concentric rings about a center of the grounding layer 122. A locating hole 128 is defined in the grounding layer 124. The grounding layer 122 is electrically connected to ground. The grounding layer 122 and the accessing layer 126 are electric conducting layers. The grounding layer 122 is electrically insulated from and the accessing layer 126 by the insulating layer 124. The detecting voltage terminal Vcc is connected to the accessing layer 126 of the detecting pad 12 via a resistor R. The controller 16 is also connected to the accessing layer 126. In the embodiment of the invention, the controller 16 is a general purpose input/output (GPIO) chip. A general purpose input pin of the GPIO is connected to the accessing layer 126 to detect a voltage signal therefrom. The controller 16 is capable of outputting a configuration file associated with the computer system that the PCB is coupled to. The controller 16 may load a first configuration file associated with the first computer system as default.

Figure 3:
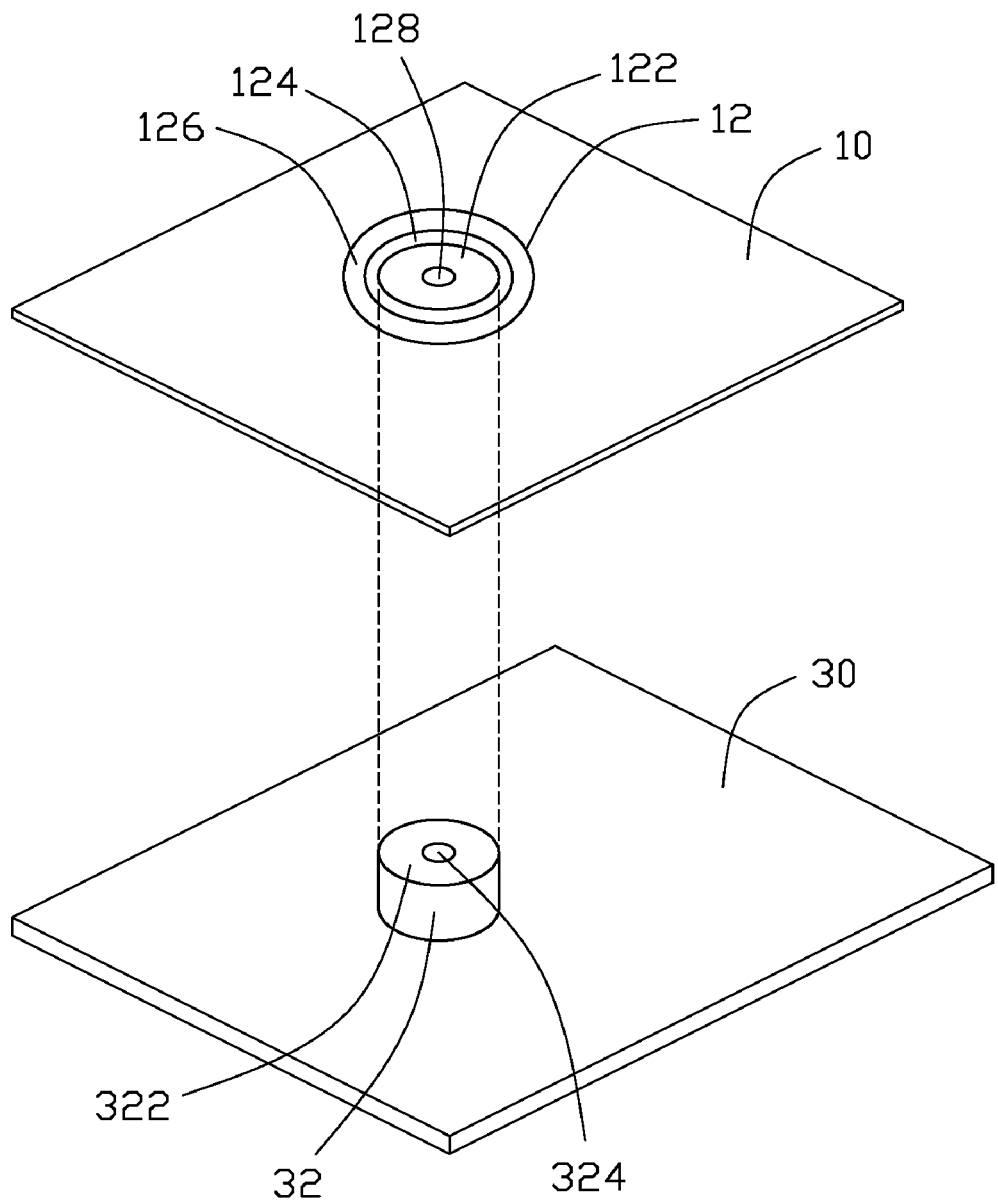
FIG. 3 is an enlarged view of FIG. 1.

Referring to FIG. 3, the first chassis 30 has a cylindrical stand 324 formed thereon. The stand 324 includes an electric conducting top surface 322. A diameter of the top surface 322 is smaller than an outer diameter of the insulating layer 124. A mounting hole 324 is defined in the stand 32 corresponding to the locating hole 128 of the detecting pad 12, such that the PCB 10 may be mounted to the first chassis 30 by engaging a screw or other fastener through the locating hole 128 and the mounting hole 324.

When the PCB 10 is assembled in the first chassis 30, a center of the stand 32 is aligned with the centre of the detecting pad 12. The top surface 322 of the stand 32 contacts the grounding layer 122 or the insulating layer 124. The controller 16 receives a high level voltage signal from the detecting pad 12. The controller 16 loads the first configuration file associated with the first computer system to the PCB 10.

Referring to FIG. 4, the second chassis 40 has a cylindrical stand 424 formed thereon. The stand 424 includes an electric conducting top surface 422. A diameter of the top surface 422 is larger than an outer diameter of the insulating layer 124. A mounting hole 424 is defined in the stand 42 corresponding to the locating hole 128 of the detecting pad 12.

When the PCB 10 is assembled in the second chassis 40, a center of the stand 42 is aligned with the center of the detecting pad 12. The top surface 422 of the stand 42 contacts the grounding layer 122 and the accessing layer 126 simultaneously. The top surface 422 electrically connects the accessing layer 126 to the grounding layer 122. The controller 16 receives a low level voltage signal from the detecting pad 12. The controller 16 loads a second configuration file associated with the second computer system to the PCB 10. Therefore, the PCB 10 is capable of determining what computer system the PCB 10 is coupled with.

It is to be understood, however, that even though numerous characteristics and advantages have been set forth in the foregoing description of preferred embodiments, together with details of the structures and functions of the preferred embodiments, the disclosure is illustrative only, and changes may be made in detail, especially in matters of shape, size, and arrangement of parts within the principles of the invention to the full extent indicated by the broad general meaning of the terms in which the appended claims are expressed.

What is claimed is:

1. A printed circuit board (PCB) assembly comprising:
   a PCB comprising:
      a detecting pad, the detecting pad comprising an accessing layer, and a grounding layer; the grounding layer being connected to ground, and the accessing layer being electrically insulated from the grounding layer;
      a detecting voltage terminal connected to the accessing layer of the detecting pad; and
      a controller connected to the accessing layer of the detecting pad;
   wherein when the accessing layer is not connected to the grounding layer, the controller receives a high level voltage signal from the detecting pad; when the accessing layer is connected to the grounding layer, the controller receives a low level voltage signal from the detecting pad; and therefore the PCB is capable of determining what computer system the PCB is coupled with.

2. The PCB assembly of claim 1, wherein the controller is capable of loading a configuration file associated with the computer system.

3. The PCB assembly of claim 1, wherein the grounding layer has a circular configuration.

4. The PCB assembly of claim 3, wherein the accessing layer has a ring configuration, and the accessing layer is disposed around the grounding layer.

5. The PCB assembly of claim 4, wherein the accessing layer and the grounding layer are concentric.

6. The PCB assembly of claim 4, wherein the detecting pad further comprises a ring-shaped insulating layer sandwiched between the accessing layer and the grounding layer.

7. The PCB assembly of claim 1, wherein the controller is a general purpose input/output chip.

8. The PCB assembly of claim 1, wherein the voltage terminal is connected to the detecting pad via a resistor.

9. A computer comprising:
a chassis, the chassis comprising a stand, the stand having an electric conducting top surface; and
a printed circuit board (PCB) for coupling with the chassis, the PCB comprising:
a detecting pad, the detecting pad comprising an accessing layer and a grounding layer; the grounding layer being connected to ground, the accessing layer being electrically insulated from the grounding layer;
a detecting voltage terminal connected to the accessing layer of the detecting pad; and
a controller connected to the accessing layer of the detecting pad, and a high level voltage signal is detected by the controller when the PCB being detached from the chassis;
wherein, when the PCB is assembled in the chassis, the stand contacts the detecting pad of the PCB, the top surface of the stand electrically connects the accessing layer to the grounding layer, a low level voltage signal is detected by the controller, and the controller is capable of loading a configuration file associated with the chassis to the PCB.

10. The computer of claim 9, wherein when a high level voltage signal is detected by the controller, the controller is capable of loading a default configuration file to the PCB.

11. The computer of claim 9, wherein the grounding layer has a circular configuration.

12. The computer of claim 11, wherein the accessing layer has a ring configuration, and the accessing layer is disposed around the grounding layer.

13. The computer of claim 12, wherein the accessing layer and the grounding layer are concentrically disposed.

14. The computer of claim 13, wherein the stand has a cylindrical configuration.

15. The computer of claim 12, wherein the detecting pad further comprises a ring-shaped insulating layer sandwiched between the accessing layer and the grounding layer.

16. The computer of claim 9, wherein the controller is a general purpose input/output chip.

17. The computer of claim 9, wherein the voltage terminal is connected to the detecting pad via a resistor.

18. The computer of claim 9, wherein a location hole is defined in the detecting pad, and a mounting hole is defined in the stand corresponding to the location hole.

* * * * *